(12) United States Patent
Yu et al.

(10) Patent No.: US 7,367,717 B2
(45) Date of Patent: May 6, 2008

(54) OPTICAL TRANSMISSION MODULE

(75) Inventors: Juhyun Yu, Hitachi (JP); Kinya Yamazaki, Hitachi (JP); Hidetaka Kawauchi, Hitachi (JP); Tenpei Inoue, Hitachi (JP); Hiroki Katayama, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 531 days.

(21) Appl. No.: 11/131,342

(22) Filed: May 18, 2005

(65) Prior Publication Data
US 2006/0133819 A1    Jun. 22, 2006

(30) Foreign Application Priority Data
Dec. 16, 2004    (JP)    .............................. 2004-364201

(51) Int. Cl.
*G02B 6/36* (2006.01)
(52) U.S. Cl. ............................ 385/90; 385/14; 385/88; 385/89; 385/92
(58) Field of Classification Search .................. 385/14, 385/49, 88–94
See application file for complete search history.

(56) References Cited

U.S. PATENT DOCUMENTS

| | | | |
|---|---|---|---|
| 2004/0197056 A1 | 10/2004 | Oki | |
| 2005/0168957 A1* | 8/2005 | Kawauchi et al. | .......... 361/749 |
| 2006/0257081 A1* | 11/2006 | Ishigami et al. | .............. 385/92 |
| 2007/0237466 A1* | 10/2007 | Togami et al. | ................ 385/92 |

FOREIGN PATENT DOCUMENTS

JP    2004-103743    4/2004

* cited by examiner

*Primary Examiner*—Hemang Sanghavi
(74) *Attorney, Agent, or Firm*—McGinn IP Law Group, PLLC

(57) ABSTRACT

An optical transmission module has: an optical module having an optical element and a receptacle portion; a circuit board that is electrically connected to the optical module through an electrical connection member; and a housing in which the optical module and the circuit board are placed. The optical module is in surface-contact with and fixed onto the housing. The receptacle portion and the circuit board are not in contact with the housing. The receptacle portion is restricted in position while having a positional degree of freedom at least in a direction perpendicular to an optical axis of light emitted from the optical element. The circuit board is restricted in position while having a positional degree of freedom at least in a direction of the optical axis.

12 Claims, 6 Drawing Sheets

OPTICAL TRANSMISSION MODULE

The present application is based on Japanese patent application No. 2004-364201, the entire contents of which are incorporated herein by reference.

BACKGROUND OF THE INVENTION

1. Field of the Invention

This invention relates to an optical transmission module for high-speed communications and, particularly, to an optical transmission module that has a good heat radiation property and can prevent problems caused by thermal expansion.

2. Description of the Related Art

FIG. 5 is a schematic side view showing a conventional optical transmission module.

As shown in FIG. 5, the optical transmission module 101 is composed of: an optical module 102 with an optical element (not shown) built therein; a receptacle portion 103 which is connected to one side of the optical module 102 to pass through a light axis of the optical element; a circuit board 105 to which a lead 104 extended on the opposite side of the optical module 102 is soldered and on which a control circuit (not shown) is mounted; and a housing 106 in which the optical module 102, the receptacle portion 103 and the circuit board 105 are placed. The optical transmission module 101 called "optical transceiver" is known that may be composed such that an optical module with an optical element for light emission built therein and an optical module with an optical element for light reception built therein are in parallel placed in one housing 106. Also, the optical module 102 is known that may be composed such that a peltiert element is placed in a metallic package with an optical element built therein to cool down the optical element.

The assembly process of the optical transmission module 101 can be simplified by previously integrating the optical module 102 and the receptacle portion 103. Also, the assembly process of the optical transmission module 101 can be simplified by placing the optical module 102 and the circuit board 105 in the housing 106 after soldering the lead 104 of the optical module 102 to the circuit board 105.

The housing 106 of the optical transmission module 101 is provided with a window 107 into which a connector (not shown) of an optical fiber as a transmission line is inserted. The connector is connected through the window 107 to the receptacle portion 103 to allow the optical coupling between the optical fiber and the optical module 102.

Conventionally, when the optical module 102, the receptacle portion 103 and the circuit board 105 are placed in the housing 106, the optical module 102 is not fixed to and not in contact with the housing 106 while the receptacle portion 103 and the circuit board 105 are fixed to the housing 106.

For example, as shown in FIG. 6, the housing 106 is composed of divided members, i.e., a housing bottom member 108 and a housing top member 109, which are provided with protrusions 111 and 112, respectively, to compose a receptacle portion supporting member 110, and the protrusions 111 and 112 are provided with a groove into which a flange 113 of the receptacle portion 103 is fitted. The receptacle portion 103 is formed cylindrical and the flange 113 protrudes radially from the outer circumference of the receptacle portion 103. Thus, by forming the groove of the protrusions 111 and 112 to be fitted to the flange 113, the receptacle portion 103 can be positioned and fixed in the optical axis direction and in two directions, i.e., vertical and lateral directions of the housing 106, perpendicular to the optical axis direction.

The reason why the optical module 102 is not fixed to the housing 106 is that it is intended to prevent the optical module 102 and the receptacle portion 103 from being subjected to a stress caused by the difference between the linear expansion coefficient of the optical module 102 and the receptacle portion 103 and the linear expansion coefficient of the housing 106 in the optical axis direction.

The reason why the optical module 102 is not in contact with the housing 106 is that the dimensions of the protrusions 111, 112 are set to minimize the error $\Delta H$ between a height $H0$ from the housing 106 bottom to the connector optical axis $C0$ and a height $H1$ from there to the receptacle portion 103 optical axis $C1$ and, further, the receptacle portion 103 is securely supported thereby and, therefore, a strain may be applied to the optical module 102 if the optical module 102 is in contact with the housing 106.

On the other hand, the housing bottom member 108 is provided with a boss 114 standing toward the circuit board 105. The boss 114 is provided with a female screw hole 115 formed on its upper portion, and the circuit board 105 is provided with a through-hole 116 corresponding to the female screw hole 115. Thus, by screwing a screw 117 through the through-hole 116 into the female screw hole 115, the circuit board 105 can be fixed to the housing 106. The screw-fixed position is set to be near an edge 118 of the circuit board 105 (i.e., far from the optical module 102) on the ground that the edge 118 is to be inserted into a circuit board connector (not shown).

For example, Japanese patent publication No. 2004-103743 discloses an equivalent to the optical transmission module 101.

In high-speed communications, it is desired that heat is efficiently radiated from the optical module 102 to the housing 106 since the amount of heat generated from the optical element is large.

However, since the optical module 102 is not fixed to and not in contact with the housing 106 while the receptacle portion 103 is fixed to the housing 106, heat is not radiated directly from the optical module 102 to the housing 106. Namely, heat of the optical module 102 is flown through the receptacle portion 103 and the protrusions 111, 112 to the housing 106. Thus, the efficiency of heat radiation is not good.

In order to improve the heat radiation, a flexible heat radiation sheet 119 may be disposed between the optical module 102 and the housing 106. Thereby, heat can be radiated through the heat radiation sheet 119, and the optical module 102 can be loosely restricted without applying a strain to the optical module 102 since the heat radiation sheet 119 is flexible. However, as the communication speed increases, the optical module 102 must have a very large heat generation and therefore it becomes difficult to address such a heat generation by the heat radiation means through the receptacle portion 103 and the heat radiation sheet 119.

On the other hand, in the conventional structure that the receptacle portion 103 is fixed to the housing 106 and the circuit board 105 is fixed to the housing 106 near the edge 118, a stress is likely to concentrate at the lead 104 or a portion where the lead 104 is soldered when the circuit board 105 thermally expands in the optical axis direction. As a result, the lead 104 may be disconnected.

SUMMARY OF THE INVENTION

It is an object of the invention to provide an optical transmission module that has a good heat radiation property and can prevent problems caused by thermal expansion.

(1) According to a first aspect of the invention, an optical transmission module comprises:

an optical module comprising an optical element and a receptacle portion that is a connection portion through which an optical signal output from the optical element is transmitted to other device;

a circuit board that is electrically connected to the optical module through an electrical connection member that extends from one end of the optical module, the circuit board comprising a control circuit mounted thereon; and a housing in which the optical module and the circuit board are placed;

wherein a predetermined surface of the optical module is in contact with a predetermined surface of the housing, the optical module is fixed onto the predetermined surface of the housing, the receptacle portion and the circuit board are not in contact with the housing, the receptacle portion is restricted in position while having a positional degree of freedom at least in a direction perpendicular to an optical axis of light emitted from the optical element, and the circuit board is restricted in position while having a positional degree of freedom at least in a direction of the optical axis.

In the first aspect of the invention, the following options may be employed.

(i) The optical module comprises a cooling element to cool the optical element, and the optical module is in contact with the housing at an outer face thereof that corresponds to a heat radiation side of the cooling element.

(ii) The housing comprises a receptacle portion supporting member by which the receptacle portion is sandwiched and supported, the receptacle portion supporting member is disposed such that a gap is generated between the housing and the receptacle portion supporting member.

(iii) The housing comprises a heat radiation sheet, and the heat radiation sheet is inserted into the gap.

(iv) The circuit board comprises a position restricting hole, the housing comprises a position restricting protrusion formed on an inside surface facing to the circuit board, the position restricting protrusion comprises a small-diameter portion that has a diameter smaller than the position restricting hole of the circuit board, and a large-diameter portion that has a diameter greater than the position restricting hole of the circuit board, and the small-diameter portion of the position restricting protrusion is inserted into the position restricting hole of the circuit board.

(2) According to a second aspect of the invention, an optical transmission module comprises:

an optical module comprising an optical element and a receptacle portion that is a connection portion through which an optical signal output from the optical element is transmitted to other device;

a circuit board that is electrically connected to the optical module through an electrical connection member that extends from one end of the optical module, the circuit board comprising a control circuit mounted thereon; and a housing in which the optical module and the circuit board are placed;

wherein a predetermined surface of the optical module is in contact with a predetermined surface of the housing, the optical module is fixed onto the predetermined surface of the housing, the receptacle portion are not in contact with the housing, the receptacle portion is restricted in position while having a positional degree of freedom at least in a direction perpendicular to an optical axis of light emitted from the optical element, the circuit board is fixed to the housing at a position that is a predetermined distance in a direction of the optical axis distant from a position that the optical module is fixed to the housing, and the predetermined distance is determined such that a thermal stress to be generated at an electrical connection portion that the circuit board is electrically connected to the optical module when the circuit board thermally expands in the direction of the optical axis is less than a shear yield stress of the electrical connection portion.

In the first and second aspects of the invention, the following options may be employed.

(v) The circuit board is electrically connected through a flexible lead to the optical module.

(vi) The circuit board is divided into a first portion that is electrically connected to the electrical connection member of the optical module and a second portion, and the first portion is electrically connected to the second portion through a flexible circuit board.

(vii) The circuit board comprises a rigid-flexible circuit board composed of a rigid layer and a flexible layer, and the rigid-flexible circuit board comprises a portion composed only of the flexible layer.

Advantages of the Invention (1) The heat radiation efficiency is very high since the optical module is in contact with the housing.

(2) The problems caused by the thermal expansion can be reduced since the receptacle portion and the circuit board are not in contact with the housing (in first aspect of the invention).

(3) The problems caused by the thermal expansion can be reduced since the circuit board is fixed to the housing at a distance such that a shear yield stress is not applied to the electrical connection portion such as solder (in the second aspect of the invention).

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

First Embodiment

Figure 1:
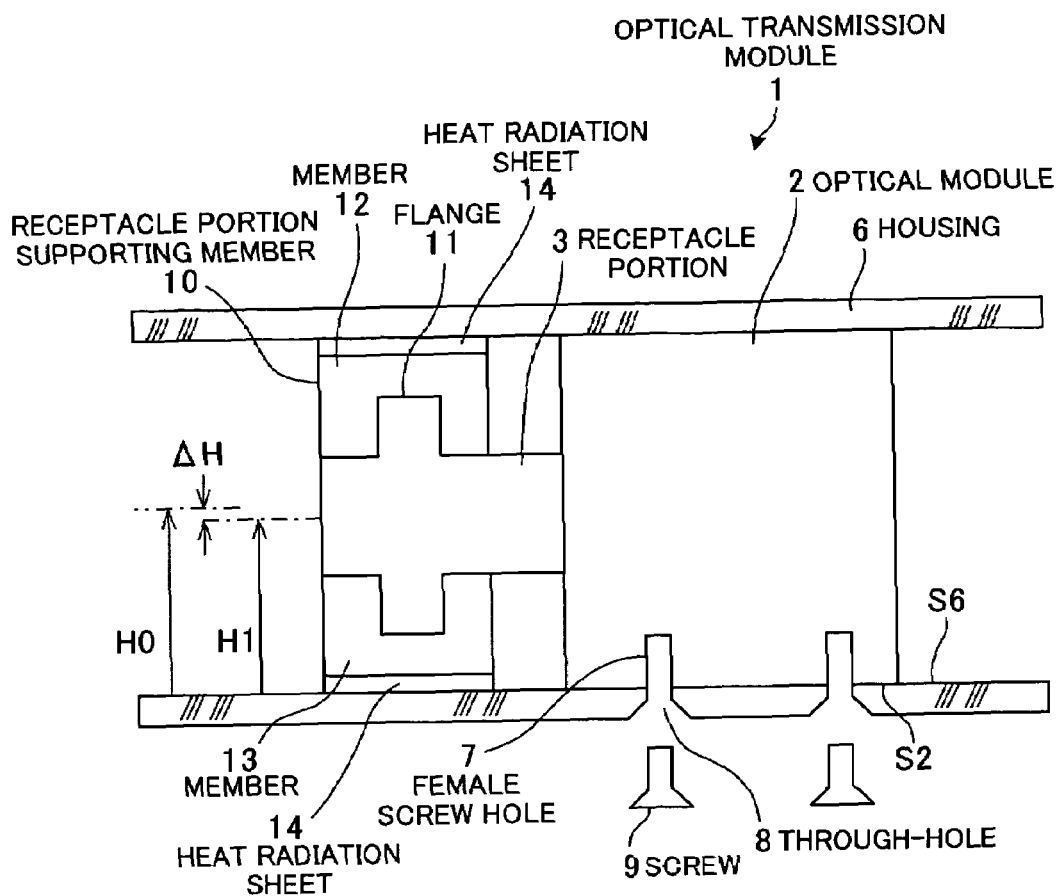
FIG. 1 is a cross sectional view showing a part of an optical transmission module in a first preferred embodiment according to the invention.
Figure 2:
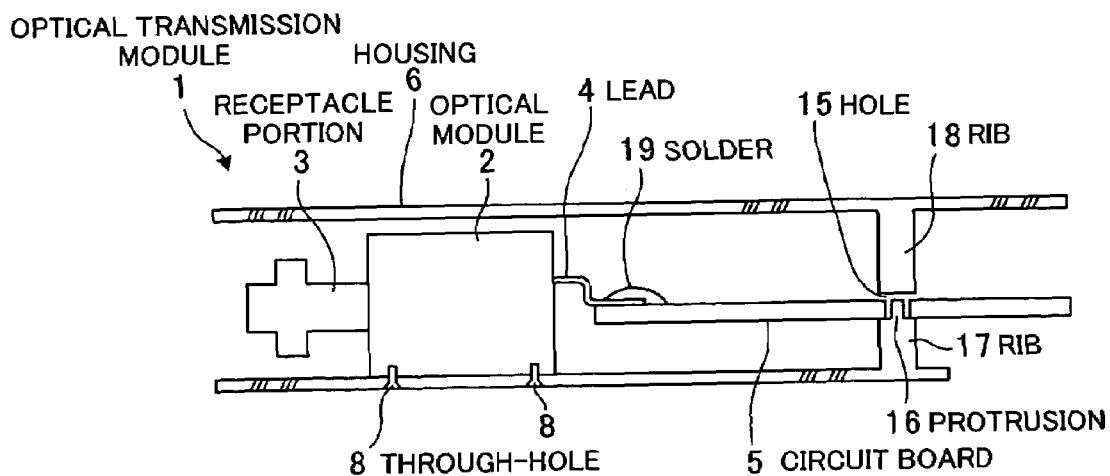
FIG. 2 is a cross sectional view showing the optical transmission module in the first embodiment.

FIG. 1 is a cross sectional view showing a part of an optical transmission module in the first preferred embodiment according to the invention. FIG. 2 is a cross sectional view showing the optical transmission module in the first embodiment.

As shown in FIGS. 1 and 2, optical transmission module 1 of the first embodiment is composed of: an optical module 2 with an optical element (See FIG. 3) built therein; a receptacle portion 3 which is connected to one side of the optical module 2 and serves as a connection part in transmitting an optical signal from the optical module 2 to other device; a circuit board 5 to which a lead 4 as an electrical connection part extended on the opposite side of the optical module 2 is electrically connected by soldering etc. and on which a control circuit (not shown) for the optical element etc. is mounted; and a housing 6 in which the optical module 2, the receptacle portion 3 and the circuit board 5 are placed.

A predetermined surface S2 (bottom surface) of the optical module 2 is directly in contacted with a predetermined surface, e.g., a surface S6 (inside bottom surface) parallel to optical axis C1, of the housing 6. Further, the optical module 2 is secured to the housing 6 at the contact surface S6 (or S2), and the receptacle portion 3 and the circuit board 5 are made to be not fixed to the housing 6. The receptacle portion 3 is restricted in position while having a positional degree of freedom at least in a direction (i.e., in this embodiment, a vertical direction of the housing 6) perpendicular to the optical axis (i.e., connector optical axis C0 and optical module optical axis C1) of light emitted from the optical element. The circuit board 5 is restricted in position while having a positional degree of freedom at least in a direction of optical axis (i.e., a direction of light propagation).

In this embodiment, a means for fixing the optical module 2 to the housing 6 is screw-in connection. Namely, a female screw hole 7 is formed on the surface S2 of the optical module 2, and a through-hole 8 is formed penetrating through the surface S6 of the housing 6. A screw 9 is screwed in from outside of the housing 6 and fastened. Thereby, the optical module 2 is fixed directly to the housing 6 while plane-contacting it.

In this embodiment, a means for restricting the position of the receptacle portion 3 with a positional degree of freedom in the direction (i.e., the vertical direction of the housing 6) perpendicular to the optical axes C0, C1 is a receptacle portion supporting member 10. The receptacle portion supporting member 10 is composed of members 12 and 13 which are vertically disposed and provided with a groove into which a flange of the receptacle portion 3 is fitted, where the receptacle portion 3 is sandwiched and positioned by the members 12 and 13. The receptacle portion supporting member 10 may be tightly restricted in the axis direction and in a width direction of the housing 6 by a protrusion (not shown) formed inside of the housing 6 when it is placed in the housing 6. However, the receptacle portion supporting member 10 is made to have a positional degree of freedom in a height direction (vertical direction) of the optical module 2. Namely, there exists a gap between the receptacle portion supporting member 10 and the surface S6 of the housing 6. Into the gap, a flexible heat radiation sheet 14 is inserted. Due to the flexibility of the heat radiation sheet 14, the receptacle portion 3 can be restricted in position while having a positional degree of freedom in the vertical direction.

In this embodiment, a means for restricting the position of the circuit board 5 with a positional degree of freedom in the optical axis direction is composed of a position restricting hole 15 which is formed on the circuit board 5 and a position restricting protrusion 16 which is formed on the surface S6 of the housing 6, provided with a diameter smaller than the hole 15 and extended into the hole 15. The protrusion 16 is formed on a rib 17 formed standing on the surface S6 of the housing 6. The rib 17 has a top face with a diameter greater than the hole 15 of the circuit board 5. Thereby, when the circuit board 5 is placed on the top face of the rib 17, the circuit board 5 is restricted in moving downward. Further, a rib 18 is formed extended from the inside top surface of the housing 6 and has a bottom face facing down to the circuit board 5 with a gap. Thereby, the circuit board 5 is restricted in moving upward in a certain distance. Since the protrusion 16 has the diameter smaller than the hole 15 of the circuit board 5, the circuit board 5 is restricted in position while having a positional degree of freedom in the optical axis direction.

Figure 3:
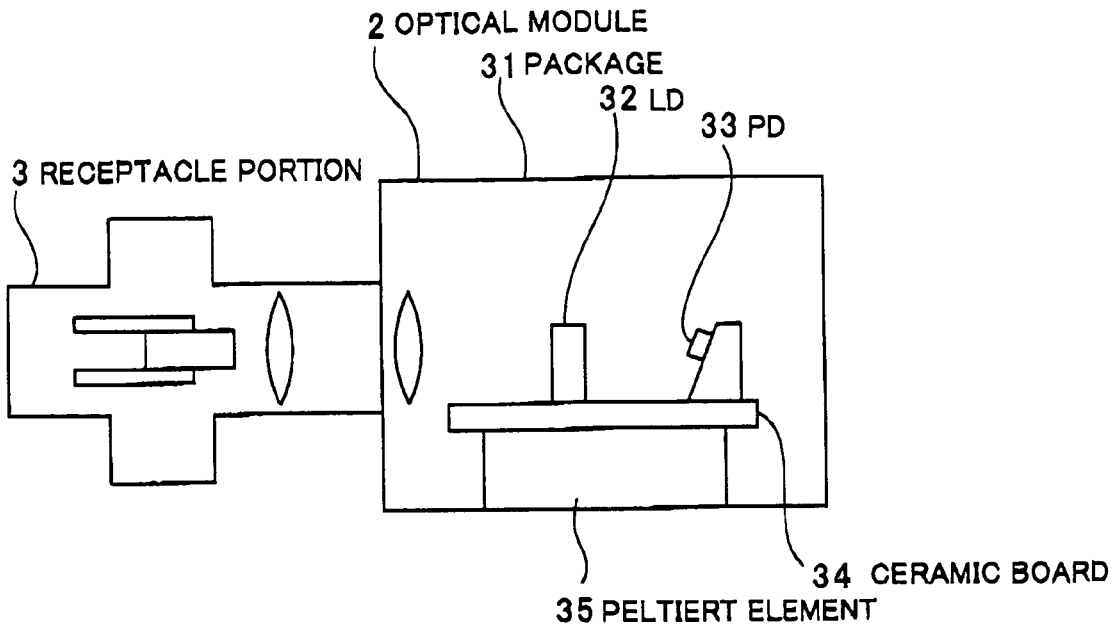
FIG. 3 is a cross sectional view showing an optical module 2 in FIG. 1.

FIG. 3 is a cross sectional view showing the optical module 2 in FIG. 1.

As shown in FIG. 3, the optical module 2 is composed of: a laser diode (LD) 32 as the optical element; a photodiode (PD) 33 as an optical element for monitoring a backward light; a ceramic board 34 on which the optical elements are mounted; a peltiert element 35 for cooling the optical element; and a rectangular-columnar metallic package 31 in which the above components are placed. The peltiert element 35 has a heat absorption side and a heat radiation side. The heat absorption side is in contact with the ceramic board 34 so as to absorb heat from the LD 32. The heat radiation side is in contact with or close to the inside of the package 31 so as to radiate heat toward the package 31. Thus, the optical transmission module 1 is constructed such that the outer face (i.e., bottom face in FIG. 3) of the optical module 2 corresponding to the heat radiation side is in contact with the housing 6.

Effects of the First Embodiment

The heat radiation efficiency is very high since the surface S2 of the optical module 2 is directly in contact with the surface S6 of the housing 6. In addition, the heat radiation efficiency is further enhanced by using the optical module 2 with the peltiert element built therein to promote the heat radiation and allowing the outer surface of the optical module 2 corresponding to the heat radiation side to be in contact with the housing 6.

The circuit board 5 is restricted in position while having a positional degree of freedom in the optical axis direction. Therefore, even when the circuit board 5 thermally expands in the optical axis direction, a stress does not concentrate at the lead 4 or a portion where the lead 4 is soldered. Thus, the disconnection of lead 4 can be prevented.

As shown in FIG. 1, an error ΔH between a height H0 from the housing 6 bottom to the connector optical axis C0 and a height H1 from there to the receptacle portion 3 optical axis C1 can be determined from the surface S6 of the housing 6 (or the surface S2 of the optical module 2). Meanwhile, although, in FIG. 1, the connector optical axis C0 is intentionally shown deviated from the receptacle portion 3 optical axis C1, the error is in fact only a minute error which corresponds to the sum of a metrication error of the housing 6 and a metrication error of the optical module 2.

Second Embodiment

Figure 4:
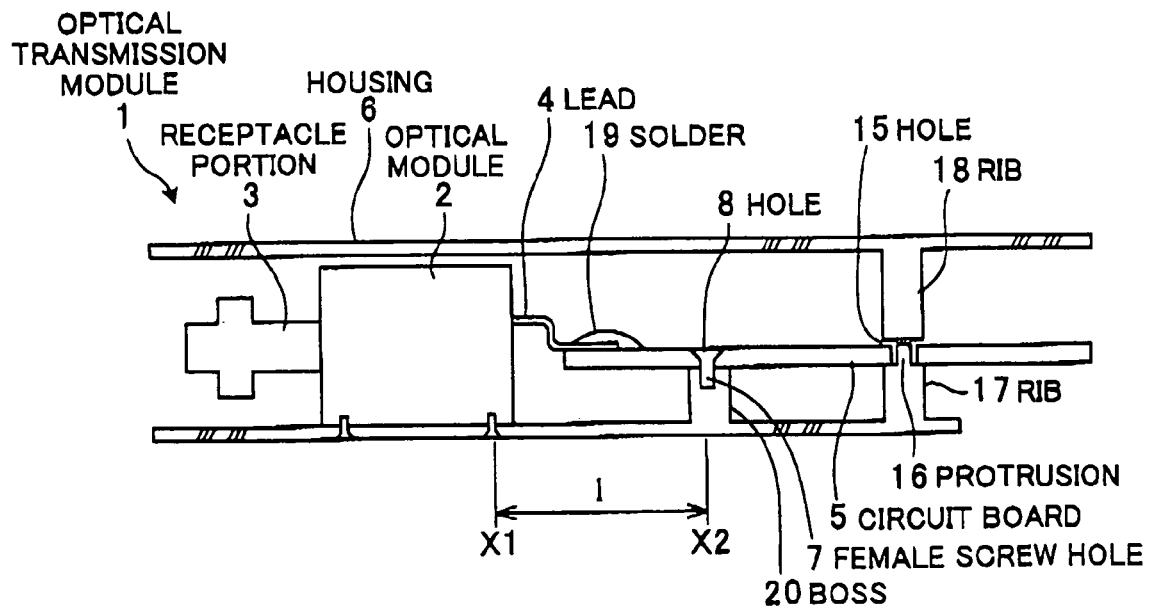
FIG. 4 is a cross sectional view showing an optical transmission module in a second preferred embodiment according to the invention.
Figure 5:
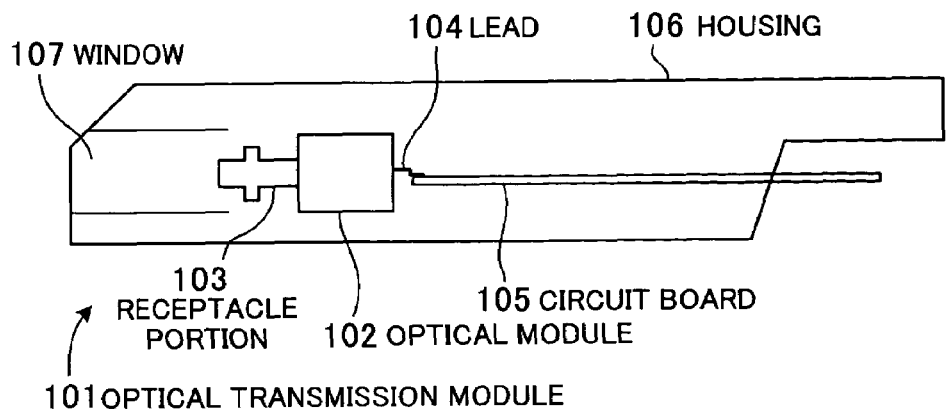
FIG. 5 is a schematic side view showing the conventional optical transmission module.
Figure 6:
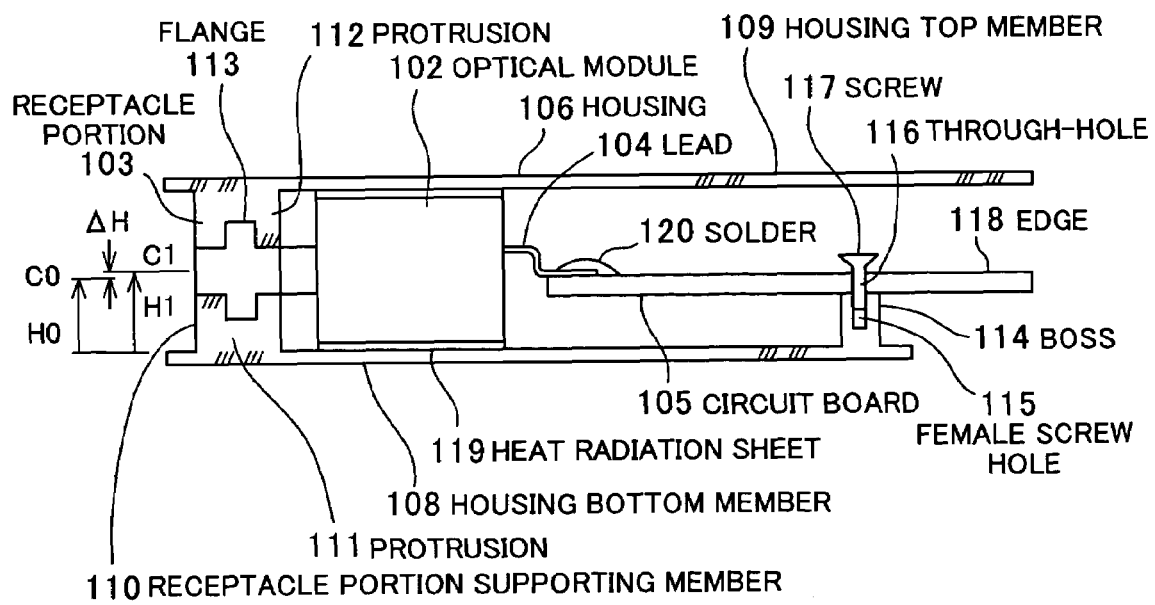
FIG. 6 is a cross sectional view showing a part of the optical transmission module.

FIG. 4 is a cross sectional view showing an optical transmission module in the second preferred embodiment according to the invention.

As shown in FIG. 4, optical transmission module 1 of the second embodiment is composed of: an optical module 2 with an optical element built therein; a receptacle portion 3 which is connected to one side of the optical module 2 and passes through an optical axis C1 from the optical module 2; a circuit board 5 to which a lead 4 extended on the opposite side of the optical module 2 is soldered and on which a control circuit (not shown) for the optical element is mounted; and a housing 6 in which the optical module 2, the receptacle portion 3 and the circuit board 5 are placed.

The optical module 2 is disposed such that the surface S2 thereof is directly in contacted with the surface S6 parallel to optical axis C1 of the housing 6. Further, the optical module 2 is secured to the housing 6 at the contact surface S6 (or S2). The receptacle portion 3 is made to be not fixed to the housing 6 and is restricted in position while having a positional degree of freedom at least in a direction perpendicular to the optical axis C1. The circuit board 5 is fixed to the housing 6 at a position X2 that is a predetermined distance "l" distant from a position X1 where the optical module 2 is fixed to the housing 6. The distance "l" is determined such that a shear stress is not applied to the solder at the soldering portion even when the circuit board 5 thermally expands in the optical axis direction.

The formulas to determine the distance "l" are as follows:

$$\lambda s = \frac{(Ws - Wf)l}{AG} = \frac{\tau hl}{G} \quad \text{Formula 1}$$

$$\tau h > \tau = \frac{G \varepsilon c}{l} \quad \text{Formula 2}$$

$$\varepsilon c = \varepsilon a - (\varepsilon e + \varepsilon p) \quad \text{Formula 3}$$

where λs is the amount of solder expansion, Ws is a shear force, Wf is a force relaxed by terminal forming etc., τ is a shear stress, εc is a difference in linear expansion coefficient, εe is the amount of liner expansion of the circuit board, εa is the amount of liner expansion of the housing, A is an area of shear plane, p is the amount of linear expansion of the optical module, G is a lateral elastic coefficient, l is a distance between X1 and X2, and τh is a shear yield stress of solder.

The formulas represent how the shear stress τ applied to the solder varies in relation to the distance "l" between the position X1 where the optical module 2 is fixed to the housing 6 and the position X2 where the circuit board 5 is fixed to the housing 6. If the distance "l" is determined such that the shear stress τ does not exceed the shear yield stress τh, the problem is not generated due to the thermal expansion of the circuit board 5.

Thus, as shown in FIG. 4, a boss 20 is formed standing toward the circuit board 5 at the position X2. The boss 20 is provided with a female screw hole 7 formed on its top face, and the circuit board 5 is provided with a hole 8 corresponding to the female screw hole 7. A screw is screwed through the hole 8 into the female screw hole 7 and fastened and, thereby, the circuit board 5 is secured to the housing 6. Further, as in the first embodiment in FIG. 2, the position restricting protrusion 16 is formed near the edge of the circuit board 5 and on the top face of the rib 17 formed standing on the surface S6 of the housing 6, and the position restricting hole 15 is formed on the circuit board 5 corresponding to the protrusion 16.

Third Embodiment

Figure 7:
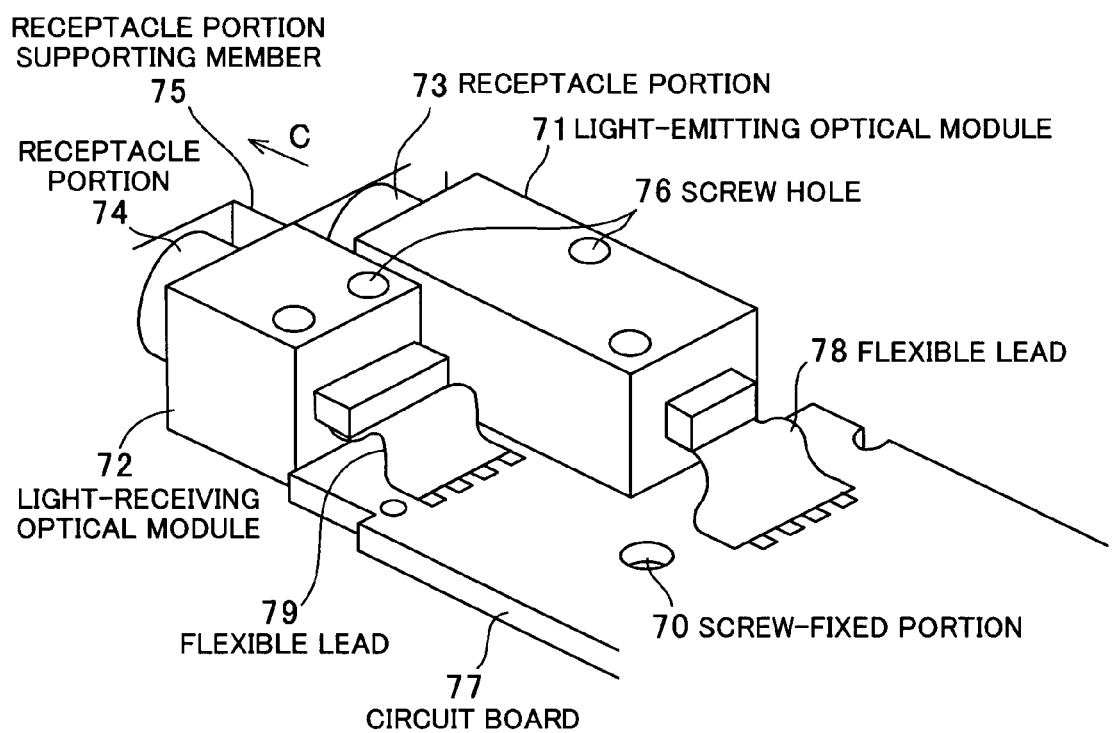
FIG. 7 is a cross sectional view showing an optical transmission module in a third preferred embodiment according to the invention.

FIG. 7 is a cross sectional view showing an optical transmission module in the third preferred embodiment according to the invention.

In the first and second embodiments, it is given that there is no difference between an optical module with an optical element for light emission built therein and an optical module with an optical element for light reception built therein. However, in fact, there is a difference in dimensions, especially in length in the optical axis direction, between the optical module for light emission and the optical module for light reception. Further, it is typical that one optical module for light emission and one optical module for light reception are in parallel placed in the housing so as to conduct a bidirectional communication by using one optical transmission module. Thus far, the circuit board5 is not explained in detail. Accordingly, shown in FIG. 7 are an example where one optical module for light emission and one optical module for light reception are arranged, and the features of a circuit board 77. Meanwhile, the housing 6 is omitted in FIG. 7.

As shown, the optical module 71 for light emission and the optical module 72 for light reception are formed rectangular-columnar, and the optical module 71 for light emission is in the optical axis C direction longer than the optical module 72 for light reception. The receptacle portions 73, 74 of the optical modules 71, 72 are supported by a receptacle portion supporting member 75 which is a means for restricting the position of the optical modules 71, 72 while giving them a positional degree of freedom perpendicular to the optical axis C.

The optical modules 71, 72 each are provided with a screw hole 76 (not shown) by which they are fixed to the housing 6. The way of fixing the optical module 71, 72 to the housing 6 and the way of making the receptacle portions 73, 74 not to be fixed to the housing 6 are as explained referring to FIG. 1.

The circuit board 77 is provided with a step (or a notch) portion so as to reduce the longitudinal difference between the optical modules 71 and 72, which have different lengths each other. The circuit board 77 is secured to the housing 6 at a screw-fixed position 70.

The optical modules 71, 72 are provided with flexible leads 78, 79 as an electrical connection portion for electrically connecting to the circuit board 77. The flexible leads 78, 79 are made of a conductor with a flexible insulating film while the lead 4 in FIG. 2 is made of a metallic round or square bar or a metallic plate. Since the flexible leads 78, 79 are used for the electrical connection between the circuit board 77 and the optical module 71, 72, even when the circuit board 77 thermally expands in the optical axis direction or it is displaced in the optical axis or other direction due to other factor, a thermal stress generated can be relaxed and reduced to less than the shear yield stress by the flexible leads 78, 79. Thus, the optical modules 71, 72 are not influenced thereby.

Fourth Embodiment

Figure 8:
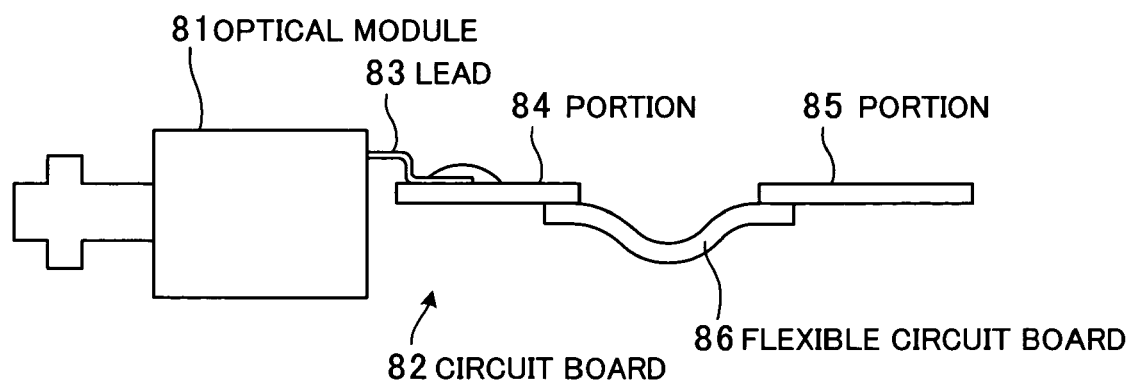
FIG. 8 is a cross sectional view showing an optical transmission module in a fourth preferred embodiment according to the invention.

FIG. 8 is a cross sectional view showing an optical transmission module in the fourth preferred embodiment according to the invention.

The fourth embodiment is composed such that a circuit board 82 connected to an optical module 81 is divided into a portion 84 which is electrically connected by soldering etc. to a lead 83 as an electrical connection member and other portion 85 on which a control circuit etc. (not shown) is mounted, and the portions 84 and 85 are electrically connected to each other by a flexible circuit board 86. The lead 83 may be replaced by the flexible lead.

In the abovementioned composition, even when the other portion 85 thermally expands in the optical axis direction or it is displaced in the optical axis or other direction due to other factor, a stress is relaxed by he flexible circuit board 86 and, therefore, the portion 84 connected to the optical module 81 is not influenced thereby. Also, even when the portion 84 thermally expands in the optical axis direction, since the amount of thermal expansion is small, a thermal stress generated is less than the shear yield stress and the optical module 81 or the lead 83 is little influenced thereby.

Fifth Embodiment

Figure 9:
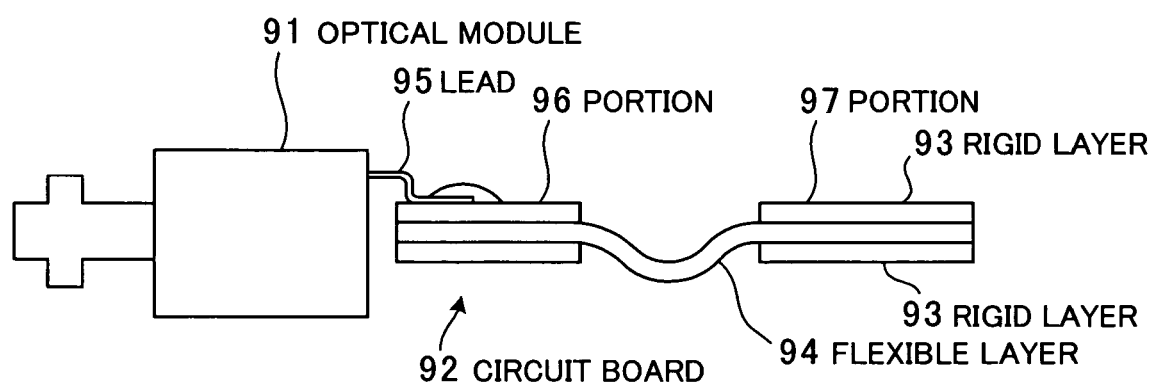
FIG. 9 is a cross sectional view showing an optical transmission module in a fifth preferred embodiment according to the invention.

FIG. 9 is a cross sectional view showing an optical transmission module in the fifth preferred embodiment according to the invention.

The fifth embodiment is composed such that a circuit board 92 connected to an optical module 91 is a rigid-flexible circuit board which is composed of a rigid layer 93 and a flexible layer 94, and at least a part of the circuit board 92 is made of only the flexible layer 94. In detail, a portion 96 which is electrically connected by soldering etc. to a lead 95 as an electrical connection member of the optical module 91 is formed such that the flexible layer 94 is sandwiched by the two rigid layers 93. Also, other portion 97 with a circuit board etc. (not shown) mounted thereon is formed such that the flexible layer 94 is sandwiched by the two rigid layers 93. A portion between the portion 96 and the portion 97 is made of only the flexible layer 94. The lead 95 may be replaced by the flexible lead. By electrically connecting using a through-hole etc. between a conductor disposed on the rigid layer 93 and a conductor disposed on the flexible layer 94, the portion 96 can be electrically connected to the portion 97.

In the abovementioned composition, even when the portion 97 thermally expands in the optical axis direction or it is displaced in the optical axis or other direction due to other factor, since the only flexible layer-made portion is flexible to relax the thermal stress, the portion 96 connected to the optical module 91 is not influenced thereby. Even when the portion 96 thermally expands in the optical axis direction, since the amount of thermal expansion is small, the optical module 91 or the lead 95 is little influenced thereby.

Assembly of Optical Transmission Module

Figure 10:
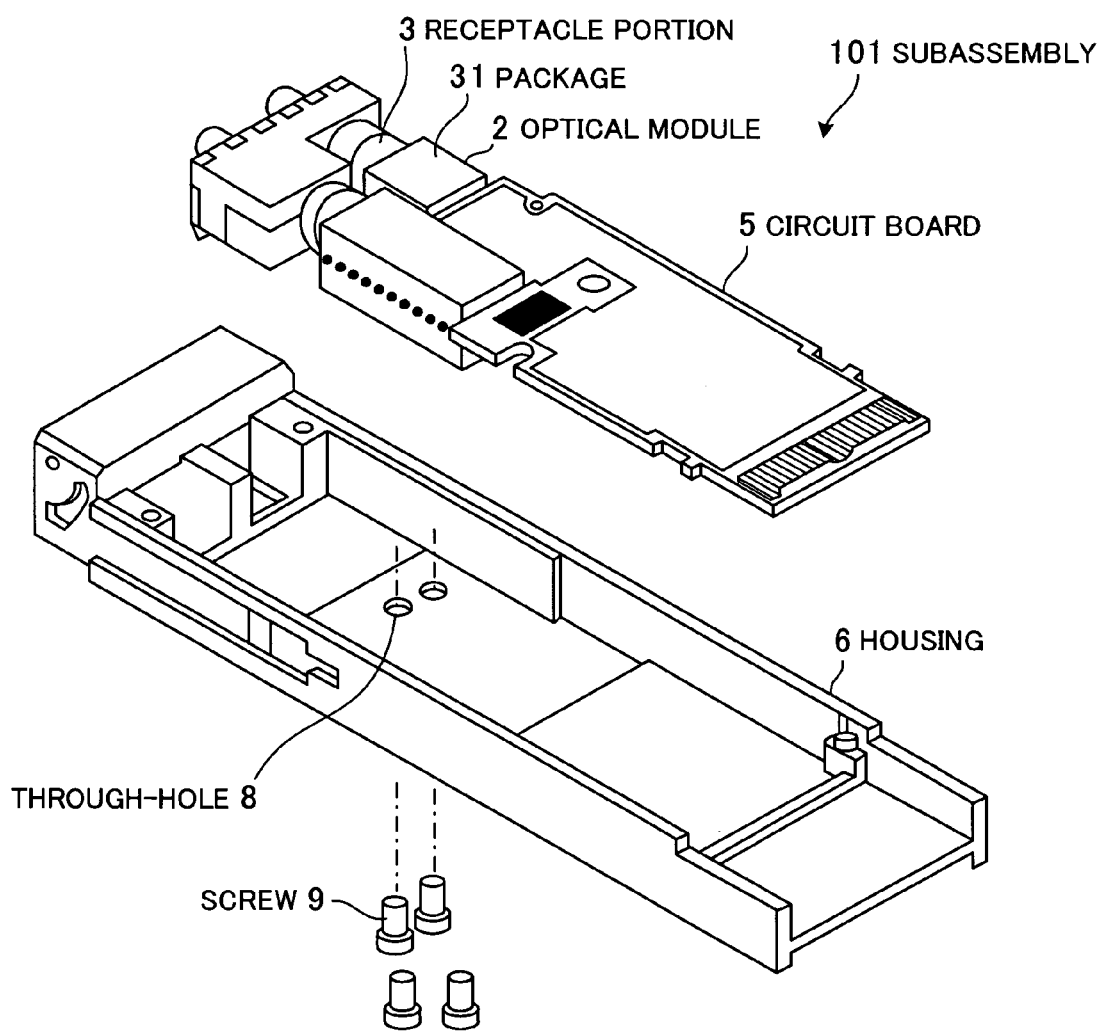
FIG. 10 is a broken perspective view showing an optical transmission module according to the invention.

FIG. 10 is a broken perspective view showing an optical transmission module according to the invention.

The optical module 2 is composed such that the optical element, monitoring element, ceramic board, peltiert element etc. are placed in the metallic rectangular-columnar package 31 (See FIG. 3). A subassembly 101 is constructed by combining the optical module 2 and the circuit board 5. On the other hand, the housing 6 is provided with a space in which the subassembly 101 is placed, and the through-holes 8 are formed at the bottom of the space. After placing the subassembly 101 in the housing 6, the screw 9 is screwed through the through-hole 8 into the female screw hole 7 which is formed at the bottom of the package 31 of the optical module 2. The screw 9 is a fixing member to fix the optical module 2 to the housing 6.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. An optical transmission module, comprising:
    an optical module comprising an optical element and a receptacle portion that is a connection portion through which an optical signal output from the optical element is transmitted to other device;
    a circuit board that is electrically connected to the optical module through an electrical connection member that extends from one end of the optical module, the circuit board comprising a control circuit mounted thereon; and
    a housing in which the optical module and the circuit board are placed;
    wherein a predetermined surface of the optical module is in contact with a predetermined surface of the housing,
    the optical module is fixed onto the predetermined surface of the housing,
    the receptacle portion and the circuit board are not in contact with the housing,
    the receptacle portion is restricted in position while having a positional degree of freedom at least in a direction perpendicular to an optical axis of light emitted from the optical element, and
    the circuit board is restricted in position while having a positional degree of freedom at least in a direction of the optical axis.

2. The optical transmission module according to claim 1, wherein:
    the optical module comprises a cooling element to cool the optical element, and
    the optical module is in contact with the housing at an outer face thereof that corresponds to a heat radiation side of the cooling element.

3. The optical transmission module according to claim 1, wherein:
    the housing comprises a receptacle portion supporting member by which the receptacle portion is sandwiched and supported,
    the receptacle portion supporting member is disposed such that a gap is generated between the housing and the receptacle portion supporting member.

4. The optical transmission module according to claim 3, wherein:
    the housing comprises a heat radiation sheet, and
    the heat radiation sheet is inserted into the gap.

5. The optical transmission module according to claim 1, wherein:
the circuit board comprises a position restricting hole,
the housing comprises a position restricting protrusion formed on an inside surface facing to the circuit board,
the position restricting protrusion comprises a small-diameter portion that has a diameter smaller than the position restricting hole of the circuit board, and a large-diameter portion that has a diameter greater than the position restricting hole of the circuit board, and
the small-diameter portion of the position restricting protrusion is inserted into the position restricting hole of the circuit board.

6. An optical transmission module, comprising:
an optical module comprising an optical element and a receptacle portion that is a connection portion through which an optical signal output from the optical element is transmitted to other device;
a circuit board that is electrically connected to the optical module through an electrical connection member that extends from one end of the optical module, the circuit board comprising a control circuit mounted thereon; and
a housing in which the optical module and the circuit board are placed;
wherein a predetermined surface of the optical module is in contact with a predetermined surface of the housing,
the optical module is fixed onto the predetermined surface of the housing,
the receptacle portion are not in contact with the housing,
the receptacle portion is restricted in position while having a positional degree of freedom at least in a direction perpendicular to an optical axis of light emitted from the optical element,
the circuit board is fixed to the housing at a position that is a predetermined distance in a direction of the optical axis distant from a position that the optical module is fixed to the housing, and
the predetermined distance is determined such that a thermal stress to be generated at an electrical connection portion that the circuit board is electrically connected to the optical module when the circuit board thermally expands in the direction of the optical axis is less than a shear yield stress of the electrical connection portion.

7. The optical transmission module according to claim 1, wherein:
the circuit board is electrically connected through a flexible lead to the optical module.

8. The optical transmission module according to claim 6, wherein:
the circuit board is electrically connected through a flexible lead to the optical module.

9. The optical transmission module according to claim 1, wherein:
the circuit board is divided into a first portion that is electrically connected to the electrical connection member of the optical module and a second portion, and
the first portion is electrically connected to the second portion through a flexible circuit board.

10. The optical transmission module according to claim 6, wherein:
the circuit board is divided into a first portion that is electrically connected to the electrical connection member of the optical module and a second portion, and
the first portion is electrically connected to the second portion through a flexible circuit board.

11. The optical transmission module according to claim 1, wherein:
the circuit board comprises a rigid-flexible circuit board composed of a rigid layer and a flexible layer, and
the rigid-flexible circuit board comprises a portion composed only of the flexible layer.

12. The optical transmission module according to claim 6, wherein:
the circuit board comprises a rigid-flexible circuit board composed of a rigid layer and a flexible layer, and
the rigid-flexible circuit board comprises a portion composed only of the flexible layer.

* * * * *